United States Patent
Degünther et al.

(10) Patent No.: US 10,042,248 B2
(45) Date of Patent: Aug. 7, 2018

(54) ILLUMINATION OPTICAL UNIT FOR A MASK INSPECTION SYSTEM AND MASK INSPECTION SYSTEM WITH SUCH AN ILLUMINATION OPTICAL UNIT

(71) Applicant: Carl Zeiss SMT GmbH, Oberkochen (DE)

(72) Inventors: Markus Degünther, Aalen (DE); Thomas Korb, Schwäbisch Gmünd (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 69 days.

(21) Appl. No.: 14/826,470

(22) Filed: Aug. 14, 2015

(65) Prior Publication Data
US 2015/0346598 A1 Dec. 3, 2015

Related U.S. Application Data

(63) Continuation of application No. PCT/EP2014/053927, filed on Feb. 28, 2014.
(Continued)

(30) Foreign Application Priority Data
Mar. 14, 2013 (DE) .................. 10 2013 204 444

(51) Int. Cl.
*G02B 17/06* (2006.01)
*G03F 1/84* (2012.01)
(Continued)

(52) U.S. Cl.
CPC ............ *G03F 1/84* (2013.01); *G02B 6/0096* (2013.01); *G02B 17/0605* (2013.01); *G21K 1/067* (2013.01); *G21K 7/00* (2013.01)

(58) Field of Classification Search
CPC .................................................. G02B 17/0605
See application file for complete search history.

(56) References Cited

U.S. PATENT DOCUMENTS 5,763,930 A 6/1998 Partlo
5,790,627 A 8/1998 Iketaki
(Continued)

FOREIGN PATENT DOCUMENTS

CN 1918667 A 2/2007
CN 102132213 A 7/2011
(Continued)

OTHER PUBLICATIONS

German Office Action, with translation thereof, for corresponding DE Appl No. 10 2013 204 444.5, dated Sep. 23, 2013.
(Continued)

*Primary Examiner* — Yara B Green
(74) *Attorney, Agent, or Firm* — Fish & Richardson P.C.

(57) ABSTRACT

An illumination optical unit for a mask inspection system is used with EUV illumination light. A hollow waveguide of the illumination optical unit serves for guiding the illumination light. The hollow waveguide has an entry opening for the illumination light and an exit opening for the illumination light. An imaging mirror optical unit, arranged downstream of the hollow waveguide serves to image the exit opening into an illumination field. This results in an illumination optical unit, the throughput of which is optimized for the EUV illumination light.

20 Claims, 2 Drawing Sheets

Related U.S. Application Data

Figure 1:
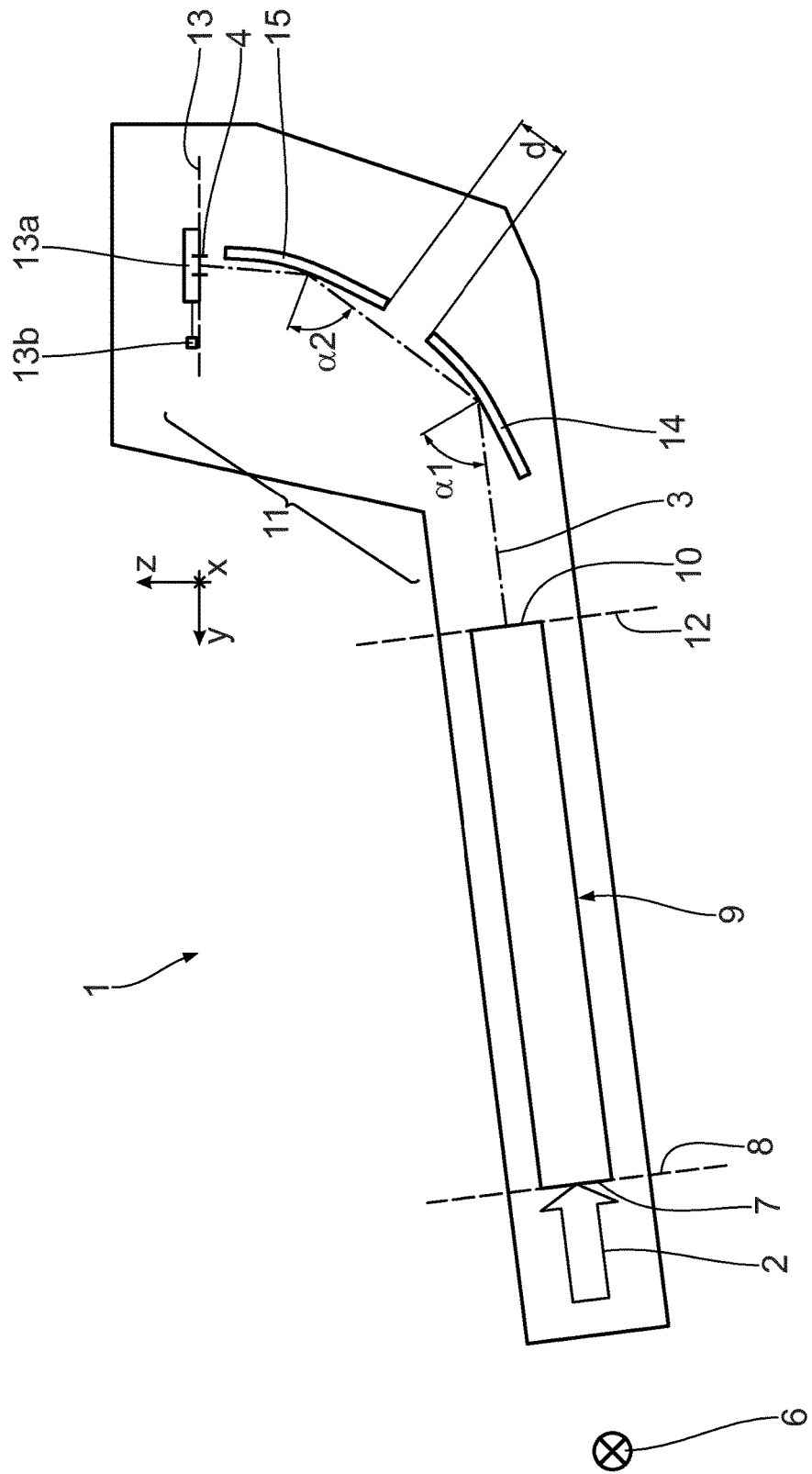

(60) Provisional application No. 61/781,874, filed on Mar. 14, 2013.

(51) Int. Cl.
    *F21V 8/00*     (2006.01)
    *G21K 1/06*     (2006.01)
    *G21K 7/00*     (2006.01)

(56) References Cited

U.S. PATENT DOCUMENTS

| | | | |
|---|---|---|---|
| 2006/0146413 A1 | 7/2006 | Klunder et al. | |
| 2007/0165782 A1 | 7/2007 | Makimura et al. | |
| 2008/0099935 A1* | 5/2008 | Egle | G03F 7/70166 264/1.7 |
| 2008/0258070 A1* | 10/2008 | Scholz | B82Y 10/00 250/372 |
| 2010/0091941 A1* | 4/2010 | Zocchi | B82Y 10/00 378/34 |
| 2010/0096557 A1* | 4/2010 | Zocchi | B82Y 10/00 250/370.09 |
| 2010/0165310 A1 | 7/2010 | Sewell et al. | |
| 2010/0259744 A1 | 10/2010 | Van Herpen et al. | |
| 2011/0116077 A1* | 5/2011 | Chuang | G01N 21/956 356/51 |
| 2011/0157573 A1 | 6/2011 | Soer et al. | |
| 2014/0078486 A1* | 3/2014 | Yakunin | B82Y 10/00 355/71 |
| 2014/0253894 A1* | 9/2014 | Van Schoot | G03F 7/70033 355/67 |

FOREIGN PATENT DOCUMENTS

| | | |
|---|---|---|
| DE | 102 20 815 A1 | 11/2003 |
| JP | H9-89812 | 4/1997 |
| JP | 2001-332489 | 11/2001 |
| JP | 2004-288803 | 10/2004 |
| JP | 2004-347463 | 12/2004 |
| JP | 2006-191090 | 7/2006 |
| JP | 2007-285909 | 11/2007 |
| JP | 2010-120090 | 6/2010 |
| JP | 2010-157717 | 7/2010 |
| JP | 2012-154902 | 8/2012 |
| JP | 2013-26424 | 2/2013 |
| WO | WO 2012/096847 | 7/2012 |
| WO | WO 2012/101 269 A1 | 8/2012 |

OTHER PUBLICATIONS

J. D. Mangus et al. "Optical Design of a Glancing Incidence X-ray Telescope" Applied Optics, 8(1):95-102 (1969).

International Search Report Corresponding to International Application No. PCT/EP2014/053927, dated Jun. 25, 2014.

Chinese office action, with English translation thereof, for corresponding Appl No. 2014 8001 3545.4, dated Jul. 24, 2017.

Japanese office action, with English translation thereof, for corresponding Appl No. 2015-562013, dated Dec. 12, 2017.

* cited by examiner

ILLUMINATION OPTICAL UNIT FOR A MASK INSPECTION SYSTEM AND MASK INSPECTION SYSTEM WITH SUCH AN ILLUMINATION OPTICAL UNIT

CROSS-REFERENCE TO RELATED APPLICATIONS

The present application is a continuation of, and claims benefit under 35 USC 120 to, international application PCT/EP2014/053927, filed Feb. 28, 2014, which claims benefit under 35 USC 119 of German Application No. 10 2013 204 444.5, filed Mar. 14, 2013. International application PCT/EP2014/053927 also claims priority under 35 USC 119(e) to U.S. Provisional Application No. 61/781,874, filed Mar. 14, 2013. The contents of International application PCT/EP2014/053927 and German patent application DE 10 2013 204 444.5 are incorporated herein by reference.

The invention relates to an illumination optical unit for a mask inspection system for use with EUV illumination light. The invention furthermore relates to a mask inspection system with such an illumination optical unit and an EUV light source.

Mask inspection systems are known from DE 102 20 815 A1 and WO 2012/101269 A1.

It is an object of the present invention to develop an illumination optical unit for such an inspection system in such a way that the throughput thereof is optimized for the EUV illumination light, which can be used for illuminating the illumination field.

According to the invention, this object is achieved by an illumination optical unit for a mask inspection system for use with EUV illumination light, comprising: a hollow waveguide for guiding the illumination light, comprising an entry opening for the illumination light and an exit opening for the illumination light; and an imaging mirror optical unit, arranged down-stream of the hollow waveguide, for imaging the exit opening into an illumination field.

The result of using a hollow waveguide and an imaging optical unit with at least one mirror for grazing incidence is an illumination optical unit, by which the illumination field can be illuminated, even while maintaining demanding requirements in respect of illumination homogeneity with, at the same time, a high throughput, i.e. a high transmission by the components of the illumination optical unit. The hollow waveguide produces good mixing of the illumination light. This results in a high efficiency of the illumination optical unit, while at the same time having a high homogeneity of the illumination of the illumination field with the illumination light. Illuminating the illumination field with a low dose variation is possible. To the extent that the mask to be inspected is scanned through the illumination field, it is possible for a variation of the illumination dose integrated in the scanning direction to achieve a value perpendicular to the scanning axis in the illumination field, which is less than 5%, and in particular, it can achieve a value which is less than 1%. An image-side numerical aperture of the imaging optical unit can be less than 0.2 and can be 0.1. The illumination field can have a typical dimension in an illumination field plane, which is less than 0.5 mm; i.e., for example, it can have an area in the region of at most 1 mm×1 mm, or else of at most 0.6 mm×0.6 mm. The illumination field can be rectangular and have dimensions of 0.6 mm×0.4 mm, or else of 0.1 mm×0.1 mm. An aspect ratio, in particular of the exit opening of the hollow waveguide, can be between 0.5 and 2, and can be e.g. 1. An inner cavity of the hollow waveguide used for reflecting the illumination light can be cuboid. The entry and exit openings can accordingly be rectangular and have the same dimensions. Typical dimensions of the entry and exit openings can lie in the range from 1 mm×1 mm to 5 mm×5 mm, e.g. at 1.0 mm×2.0 mm or at 1.5 mm×2.0 mm. The hollow waveguide can be longer than 300 mm, can be longer than 400 mm and can also be longer than 500 mm. A number n of the reflections of the illumination light in the hollow waveguide can be 10 at most. All surfaces of the illumination optical unit reflecting the illumination light can carry a highly reflective coating, in particular a ruthenium coating.

The imaging mirror optical unit can have at least one mirror for grazing incidence of the illumination light, with a mean angle of incidence ($\alpha 1$, $\alpha 2$) which is greater than 60°. Such a mean angle of incidence of the mirror for grazing is an angle of incidence of a central ray of an illumination light beam incident on the respective mirror. The mean angle of incidence on the at least one mirror for grazing incidence can be greater than 65°, can be greater than 70°, can be greater than 75°, can be greater than 80° and can also be greater than 85°.

The imaging mirror optical unit can have exactly two mirrors for grazing incidence of the illumination light, each with a mean angle of incidence ($\alpha 1$, $\alpha 2$) which is greater than 60°. Such an imaging mirror optical unit with exactly two mirrors was found to be particularly suitable. A sum of the mean angles of incidence of the illumination light on these two mirrors can be greater than 130°, can be greater than 135°, can be greater than 140°, can be greater than 145°, and can be 149°.

A minimum distance between the optically used faces which is less than 300 mm leads to a compact configuration of the illumination optical unit. This minimum distance can be 50 mm or else 25 mm. Alternatively, or in addition thereto, the distance between the optically used faces of two neighboring mirrors can be greater than 3 mm. This ensures that the neighboring mirrors can each be mounted with the aid of a stable mirror mount.

The imaging mirror optical unit can be embodied in the style of a Wolter telescope. Such an embodiment results in an illumination optical unit with a particularly high throughput.

In particular, the imaging optical unit of the illumination optical unit can be embodied as a type I Wolter optical unit.

The imaging mirror optical unit can have an ellipsoid mirror for grazing incidence of the illumination light, with a mean angle of incidence ($\alpha 1$) which is greater than 60°. The imaging mirror optical unit can have a hyperboloid mirror for grazing incidence of the illumination light, with a mean angle of incidence ($\alpha 2$) which is greater than 60°. Such embodiments of the mirrors as ellipsoid mirrors or as hyperboloid mirrors were found to be particularly suitable. At least two of the mirrors of the illumination optical unit or, if the illumination optical unit has more than two mirrors, all mirrors of the illumination optical unit can have a common axis of rotational symmetry. The ellipsoid mirror can be the first mirror of the imaging optical unit in the beam path of the illumination light downstream of the hollow waveguide. An entry back focus of the ellipsoid mirror can be greater than 150 mm, can be greater than 250 mm and can be greater than 300 mm. An exit back focus of the hyperboloid mirror can lie in the region between 50 mm and 100 mm and can be 60 mm.

Greater back focuses of the illumination optical unit, in particular of a Wolter telescope, are possible, e.g. an exit back focus at infinity. Then, this can result in an illumination optical unit with a telecentric illumination of the illumination field.

A minimum angle of incidence of the illumination light in the hollow waveguide can be greater than 80°. Such a minimum angle of incidence leads to a hollow waveguide with, firstly, a good mixing effect for an intensity of the illumination light in the exit opening and, secondly, high throughput.

An overall reflectivity for the illumination light can be greater than 40%. Such an overall reflectivity results in a very advantageous throughput for the use of EUV illumination light. The overall reflectivity emerges as a product of the reflectivities of all mirror components of the illumination optical unit on which the illumination light is incident.

A mask inspection system for inspecting a lithography mask can comprise: an illumination optical unit as discussed above; an EUV light source for producing the illumination light; a projection optical unit for imaging the illumination field in an image field; and a detection device for detecting illumination light incident on the image field.

The advantages of such a mask inspection system correspond to those that were already explained above with reference to the illumination optical unit according to the invention. A wafer inspection system also can have a corresponding configuration. The inspection system can have an object mount for mounting the object to be inspected, which mount is mechanically coupled to an object displacement drive such that a scanning displacement of the object during this illumination is possible.

The inspection system can be a system for an actinic mask inspection.

Figure 2:
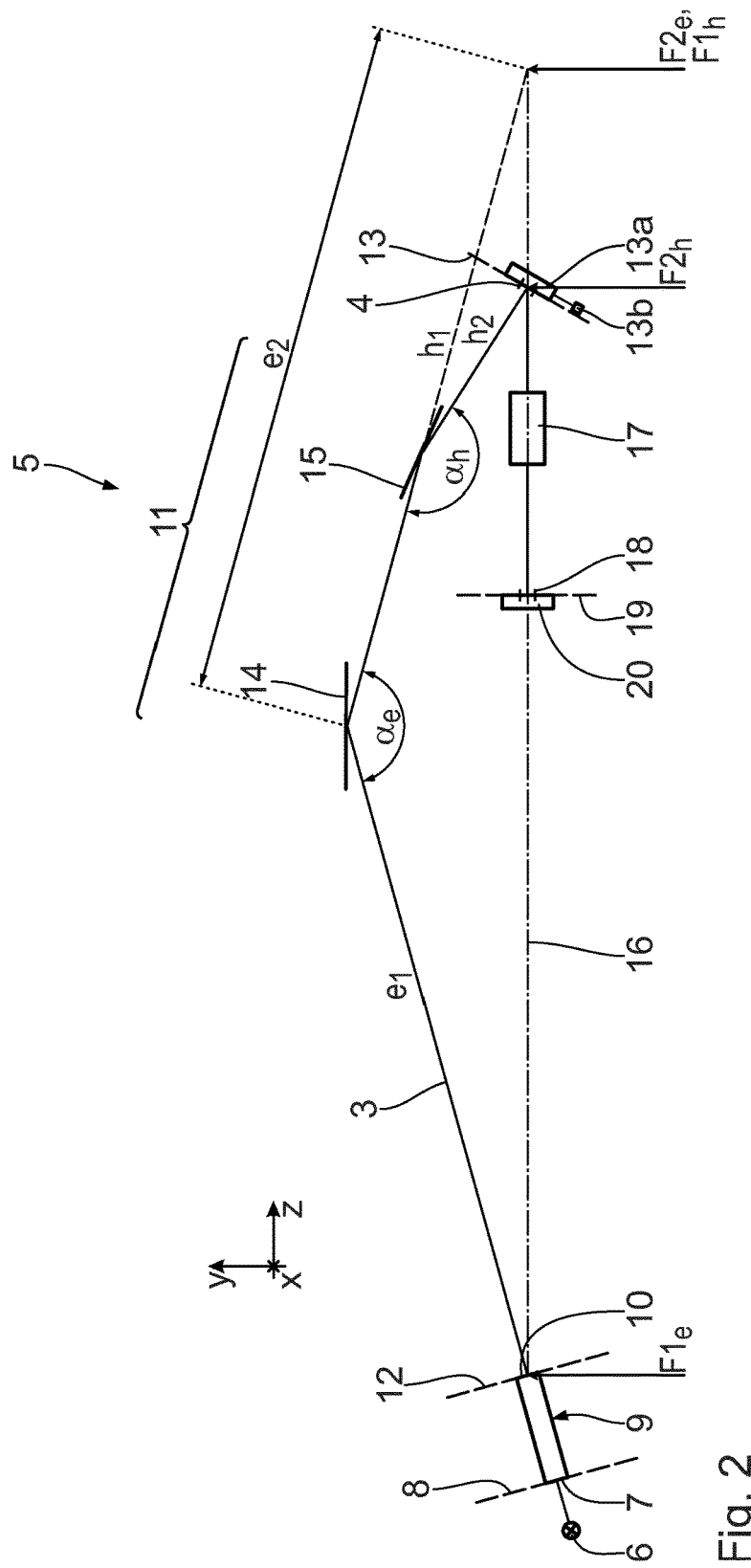

An exemplary embodiment of the invention will be explained in more detail below on the basis of the drawing. In detail:

FIG. 1 schematically shows an illumination optical unit for a mask inspection system for use with EUV illumination light; and FIG. 2 shows very schematically a beam path of a chief ray of a central illumination field point, from an exit opening of a hollow waveguide of the illumination optical unit, via an object to be inspected, to an image field in an image plane or detection plane of the inspection system.

An illumination optical unit 1 is a component of a mask inspection system for use with EUV illumination light 2. A beam path of the illumination light 2 is respectively depicted very schematically in the drawing and merely depicted for a chief ray 3 of a central field point of an illumination field 4 of the mask inspection system 5.

The illumination light 2 is produced by an EUV light source 6. The light source 6 can produce EUV used radiation in a wavelength range between 2 nm and 30 nm, for example in the range between 2.3 nm and 4.4 nm or in the range between 5 nm and 30 nm, for example at 13.5 nm. The light sources conventional for EUV lithography systems or projection exposure apparatuses, that is to say e.g. laser produced plasma (LPP) sources or discharge produced plasma (DPP) sources, can also be used for the light source 6.

After emission by the light source 6, the illumination light 2 is initially focused by a collector (not depicted here) and focused in an entry opening 7 in an entry plane 8 of a hollow waveguide 9. A largest part of the illumination light 2 experiences multiple reflections in the hollow waveguide 9. The number n of reflections in the hollow waveguide 9 is at most 10.

An aspect ratio of the entry opening 7 and of an exit opening 10, with the same dimensions, for the illumination light 2 lies between 0.5 and 2. The entry opening 7 and the exit opening 10 are each rectangular with typical dimensions in the range between 1 mm and 5 mm. Typical dimensions of the entry opening 7 and of the exit opening 10 of the hollow waveguide 9 are 1.0 mm×2.0 mm or 1.5 mm×2.0 mm.

An inner wall of a waveguide cavity of the hollow waveguide 9 is provided with a coating, e.g. a ruthenium coating, that is highly reflective for the illumination light 2. In accordance with the rectangular entry and exit openings 7, 10, the waveguide cavity is cuboid. In the beam direction of the illumination light 2, the hollow waveguide 9 has a typical length of 500 mm.

An imaging optical unit 11 arranged downstream of the hollow waveguide 9 images the exit opening 10 of the hollow waveguide 9, lying in an exit plane 12, into the illumination field 4 in an object plane 13. An image-side numerical aperture of this image is 0.1.

In order to simplify positional relations, a Cartesian xyz-coordinate system is used in the following text. The x-axis is perpendicular to the plane of the drawing in FIGS. 1 and 2. The z-axis in each case extends in the beam direction of the chief ray 3 of the illumination light 2.

A reticle 13a to be inspected is arranged in the object plane 13. The reticle 13a has a mechanical functional connection to a reticle displacement drive 13b, by which the reticle 13a is displaced along an object displacement direction y during a mask inspection. By this approach, a scanning displacement of the reticle 13a in the object plane 13 is possible.

The illumination field 4 has a typical dimension in the object plane 13 which is less than 0.5 mm, and which is 0.6 mm in the x-direction and 0.45 mm in the y-direction in the depicted embodiment.

The x/y aspect ratio of the illumination field 4 corresponds to the x/y aspect ratio of the exit opening 10.

The imaging optical unit 11 has two mirrors 14, 15 for grazing incidence of the illumination light 2. A mean angle of incidence $\alpha 1$ for the mirror 14 or $\alpha 2$ for the mirror 15 is greater than 60° in each case. A sum $\alpha = \alpha 1 + \alpha 2$ of these two mean angles of incidence is 149° in the illumination optical unit 1.

In the depicted embodiment, the imaging optical unit 11 has exactly two mirrors for grazing incidence, namely the mirrors 14 and 15. A minimum distance d between the optically used faces of the two mirrors 14, 15 is 25 mm.

The imaging optical unit 11 is embodied in the style of a Wolter telescope, namely in the style of a type I Wolter optical unit. Such Wolter optical units are described in J. D. Mangus, J. H. Underwood "Optical Design of a Glancing Incidence X-ray Telescope", Applied Optics, Vol. 8, 1969, page 95 and the references cited therein. Instead of a paraboloid, use can also be made of a hyperboloid in such Wolter optical units. Such a combination of an ellipsoid mirror with a hyperboloid mirror also constitutes a type I Wolter optical unit.

The first mirror 14 in the beam path of the illumination light 2 after the hollow waveguide 9 is embodied as an ellipsoid mirror. The subsequent mirror 15 in the beam path of the illumination light 2 is embodied as a hyperboloid mirror. The mirror faces of the two mirrors 14, 15 have a common axis of symmetry 16, which is plotted in the meridional section of the imaging optical unit 11 of FIG. 2. The optically used faces of the two mirrors 14, 15 cover an azimuth angle in the circumferential direction around the axis of symmetry 16, which is significantly less than 180°.

An entry back focus e1 of the ellipsoid mirror 14 is approximately 330 mm.

An exit back focus h2 of the hyperboloid mirror 15 is approximately 60 mm. In a variant (not depicted here) of the imaging optical unit 11, an exit pupil of the imaging optical unit 11 lies at infinity. This then results in a telecentric illumination optical unit on the illumination field side.

A minimum angle of incidence for the illumination light 2 in the hollow waveguide 9 is 88°.

A reflectivity of the hollow waveguide 9 for the illumination light 2 is approximately 90%. 73% of the illumination light 2 entering the hollow waveguide 9 are reflected by the first mirror 14 of the imaging optical unit 11. 57% of the illumination light 2 originally entering the entry opening 7 are reflected by the second mirror 15 of the imaging optical unit 11 into the illumination field 4. An overall reflectivity of the illumination optical unit 1 is therefore 57%.

FIG. 2 moreover plots:
an exit back focus e2 of the ellipsoid mirror 14,
an entry back focus h1 of the hyperboloid mirror 15,
the two focal points F1e and F2e of the ellipsoid mirror 14,
the two focal points F1h and F2h of the hyperboloid mirror 15,
a beam angle αe=2 α1 on the ellipsoid mirror 14, and
a beam angle αh=2 α2 on the hyperboloid mirror 15.

The illumination field 4 is imaged in an image field 18 in an image plane 19 via a projection optical unit 17 only indicated schematically in FIG. 2. A beam path of the chief ray 3 between the object field 4 and the image field 18 coincides with the axis of symmetry 16 in the schematic illustration of FIG. 2. This is not mandatory.

The image field 18 is detected by a detection device 20, e.g. by a CCD camera or a plurality of CCD cameras.

Using the mask inspection system 5, an inspection of e.g. a structure on the reticle 13a is possible.

The invention claimed is:

1. An illumination optical unit, comprising:
a hollow waveguide configured to guide EUV light from an entry opening of the hollow waveguide to an exit opening of the hollow waveguide during use of the illumination optical unit; and
an imaging mirror optical unit downstream of the hollow waveguide along a path of the EUV light through the illumination optical unit during use of the illumination optical unit,
wherein:
the imaging mirror optical unit comprises first and second mirrors, which are the only mirrors of the imaging optical unit;
a minimum distance between optically used faces of the first and second mirrors is less than 300 mm;
during use of the illumination optical unit:
the EUV light impinges on the first mirror and then the second mirror without impinging on a reflective surface between the first and second mirrors; and
the EUV light impinges on the first mirror and then the second mirror without any vector of the EUV light reversing direction;
for each of the first and second mirrors, the EUV light is incident on the mirror with a mean angle of incidence greater than 60°; and
the imaging mirror optical unit is configured to image the exit opening of the hollow waveguide into an illumination field to illuminate a mask located in the illumination field.

2. The illumination optical unit of claim 1, wherein the imaging mirror optical unit comprises a Wolter telescope.

3. The illumination optical unit of claim 1, wherein a mirror selected from the group consisting of the first mirror and the second mirror comprises an ellipsoid mirror.

4. The illumination optical unit of claim 1, wherein a mirror selected from the group consisting of the first mirror and the second mirror comprises a hyperboloid mirror.

5. The illumination optical unit of claim 1, wherein a minimum angle of incidence of the EUV light in the hollow waveguide is greater than 80°.

6. The illumination optical unit of claim 1, wherein an overall reflectivity of the illumination optical unit for the EUV light is greater than 40%.

7. The illumination optical unit of claim 1, wherein the first mirror comprises an ellipsoid mirror, and the second mirror comprises an ellipsoid mirror.

8. The illumination optical unit of claim 1, wherein the first mirror comprises a hyperboloid mirror, and the second mirror comprises a hyperboloid mirror.

9. A system, comprising:
an EUV light source;
an illumination optical unit, comprising:
a hollow waveguide configured to guide EUV light from an entry opening of the hollow waveguide to an exit opening of the hollow waveguide during use of the system; and
an imaging mirror optical unit downstream of the hollow waveguide along a path of the EUV light through the illumination optical unit during use of the system, the imaging mirror optical unit being configured to image the exit opening of the hollow waveguide into an illumination field;
a projection optical unit configured to image the illumination field into an image field; and
a detection device configured to detect EUV incident on the image field,
wherein:
the imaging mirror optical unit comprises first and second mirrors, which are the only mirrors of the imaging optical unit;
a minimum distance between optically used faces of the first and second mirrors is less than 300 mm; and
during use of the illumination optical unit:
the EUV light impinges on the first mirror and then the second mirror without impinging on a reflective surface between the first and second mirrors;
the EUV light impinges on the first mirror and then the second mirror without any vector of the EUV light reversing; and
for each of the first and second mirrors, the EUV light is incident on the mirror with a mean angle of incidence greater than 60°.

10. The system of claim 9, wherein the imaging mirror optical unit comprises a Wolter telescope.

11. The system of claim 9, wherein a minimum angle of incidence of the EUV light in the hollow waveguide is greater than 80°.

12. The system of claim 9, wherein an overall reflectivity of the illumination optical unit for the EUV light is greater than 40%.

13. The system of claim 9, wherein the first mirror comprises an ellipsoid mirror, and the second mirror comprises an ellipsoid mirror.

14. The system of claim 9, wherein the first mirror comprises a hyperboloid mirror, and the second mirror comprises a hyperboloid mirror.

15. A method, comprising:

using an illumination optical unit to illuminate a lithography mask in an illumination field with EUV light, the illumination optical unit comprising:

a hollow waveguide configured to guide the EUV light from an entry opening of the hollow waveguide to an exit opening of the hollow waveguide; and an imaging mirror optical unit downstream of the hollow waveguide along a path of the EUV light through the illumination optical unit, wherein:

the imaging mirror optical unit comprises first and second mirrors, which are the only mirrors of the imaging optical unit;

a minimum distance between optically used faces of the first and second mirrors is less than 300 mm;

during the method:

the EUV light impinges on the first mirror and then the second mirror without impinging on a reflective surface between the first and second mirrors;

the EUV light impinges on the first mirror and then the second mirror without any vector of the EUV light reversing; and for each of the first and second mirrors, the EUV light is incident on the mirror with a mean angle of incidence greater than 60°; and the imaging mirror optical unit images the exit opening of the hollow waveguide into an illumination field.

16. The method of claim 15, further comprising using a projection optical unit to project an image of the lithography mask into an image field.

17. The method of claim 16, further comprising detecting EUV light incident on the image field.

18. The method of claim 15, further comprising detecting EUV light incident on the image field.

19. The method of claim 15, wherein the first mirror comprises an ellipsoid mirror, and the second mirror comprises an ellipsoid mirror.

20. The method of claim 15, wherein the first mirror comprises a hyperboloid mirror, and the second mirror comprises a hyperboloid mirror.

* * * * *